United States Patent [19]

Price

[11] Patent Number: 4,529,059

[45] Date of Patent: Jul. 16, 1985

[54] VIBRATING DIAPHRAGM TYPE AUDIBLE DEVICE WITH ACOUSTICALLY IMPROVED GRILLE AND METHOD

[75] Inventor: Owen G. Price, Mokena, Ill.

[73] Assignee: Federal Signal Corporation, Oak Brook, Ill.

[21] Appl. No.: 453,231

[22] Filed: Dec. 27, 1982

[51] Int. Cl.³ .................. H05K 5/00

[52] U.S. Cl. .................. 181/148; 181/157

[58] Field of Search .................. 181/148, 150, 151, 152, 181/157, 176, 177, 198

[56] References Cited

U.S. PATENT DOCUMENTS

| | | | |
|---|---|---|---|
| 1,097,499 | 5/1914 | Young | 181/157 X |
| 1,587,096 | 6/1926 | Wheeler | 181/177 X |
| 2,131,593 | 9/1938 | Marshall | 181/148 |
| 2,890,297 | 6/1959 | Lehr | 181/148 X |
| 3,424,850 | 1/1969 | Southard et al. | 181/157 X |
| 3,716,671 | 2/1973 | Karr | 181/150 X |
| 3,952,834 | 4/1976 | Soma et al. | 181/148 X |
| 4,424,881 | 1/1984 | Hattori | 181/150 X |

*Primary Examiner*—Donald A. Griffin

*Attorney, Agent, or Firm*—Charles F. Pigott, Jr.

[57] ABSTRACT

An audible device of the vibrating diaphragm type which has improved acoustical performance by reducing the open area of the acoustical wave egress port. Through use of a masked grille having a small percentage of open grille space it is possible to improve the performance of a vibrating diaphragm type audible device such as a vibratory horn by increasing its energy transfer or acoustical output.

10 Claims, 8 Drawing Figures

VIBRATING DIAPHRAGM TYPE AUDIBLE DEVICE WITH ACOUSTICALLY IMPROVED GRILLE AND METHOD

BRIEF SUMMARY OF THE INVENTION

The present invention relates to a vibrating diaphragm audible device such as a vibratory horn, and in particular to a novel masked grille for use with such a device for the purpose of improving energy transfer and increasing audible output.

It has heretofore been believed that any blockage of the grille or acoustical wave egress port of an audible device such as a vibratory horn will necessarily reduce the audible output of such a horn. However, the present invention is based upon the discovery that within certain limits it is possible to increase the audible output of a vibrating diaphragm audible device such as a vibratory horn by blocking off or masking a substantial percentage of the open horn grille area to reduce the normal acoustical wave egress port provided by the grille. While such masking reduces the egress port through which the sound energy must pass, it has nevertheless been found that such masking can increase audible output.

It is therefore a general object of the present invention to provide a vibrating diaphragm type audible device including an egress grille having substantial portions thereof masked by an acoustically opaque member leaving substantially less open grille space than afforded by conventional horn grilles and the like.

The foregoing and other objects and advantages of the invention will be apparent from the following description of certain preferred embodiments, taken in conjuction with the accompanying drawings.

Now, in order to acquaint those skilled in the art with the manner of making and using the invention, there will be described, in conjunction with the accompanying drawings, certain preferred embodiments of the invention.

DETAILED DESCRIPTION OF THE INVENTION

Figure 1:
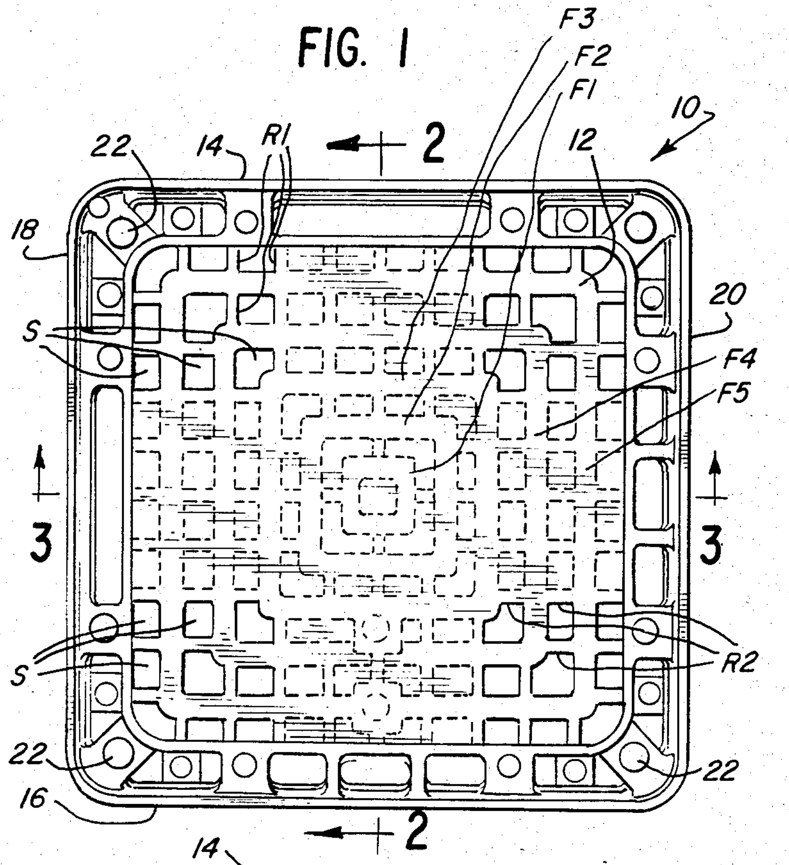
FIG. 1 is a rear elevational view of a vibratory horn grille having a substantial portion of normally open area masked by an acoustically opaque member in accordance with the present invention.
Figure 2:
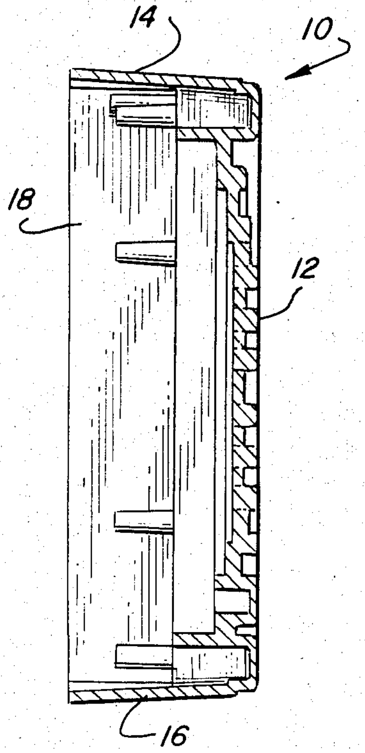
FIG. 2 is a sectional view taken substantially along the line 2—2 of FIG. 1.
Figure 3:
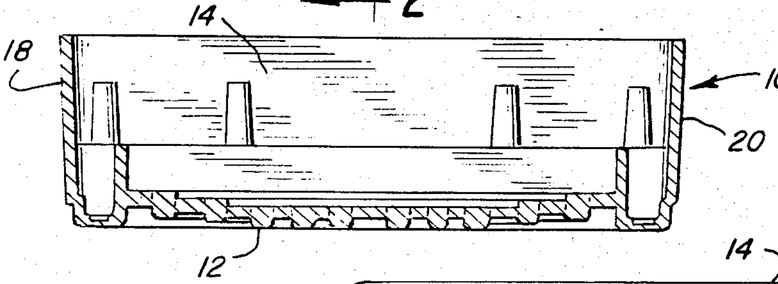
FIG. 3 is a sectional view taken substantially along the line 3—3 of FIG. 1.

Referring now to the drawings, FIGS. 1–3 show a vibratory horn grille 10 having a front 12, top 14, bottom 16, and side walls 18 and 20. The horn grille 10 is provided with four screw openings 22, one in each corner of the grille, to permit the grille to be mounted on the front of a vibratory horn or other vibrating diaphragm type audible device. By way of example, vibratory horns are commonly mounted on interior walls of buildings to function as emergency warning devices such as fire alarm warning horns.

If the shading in FIG. 1 is disregarded, there is shown a conventional horn grille where the front wall 12 is provided with substantial open space to permit sound energy to be emitted therethrough. In a conventional horn grille, such open space is at least 35% of the total grille area and commonly over 60% of the total grille area is open to permit the sound energy created by a vibrating diaphragm audible device to pass out through the open grille.

While the specific design of the grille structure per se is not a part of the present invention, it will be seen by way of example that the grille 12 in FIG. 1 is comprised of five square frame members F1 through F5 arranged in concentric fashion one inside the other and interconnected by a plurality of vertical ribs R1 and horizontal ribs R2 spaced apart to provide open spaces S between the various vertical and horizontal ribs which interconnect the square frames. As indicated above, the open spaces S conventionally comprise at least 35% of the area of the total area of grille front 12, and commonly comprise 60% or more of that area. Furthermore, it has generally been believed that any significant reduction of such open grille area will impair the sound output of a horn or other vibrating diaphragm type audible device.

The shaded area of FIG. 1 represents a modification of the grille in accordance with the present invention where an acoustically opaque masking member is utilized to close many of the openings S and thereby substantially reduce the total open area of the grille 12. In the embodiment of FIG. 1, the masked area is in the form of a cross comprised of a vertical masked strip and an intersecting horizontal masked strip. As a result, those openings S which remain are located in four generally rectangular corner areas of the grille 12.

In the embodiment of FIG. 1, the open area is approximately only 13.5% of the total grille area. Moreover, efficiency, which is a measure of acoustical watts produced divided by electrical watts input, has been found to be 4.03%, an improvement of 40.9% over the same grille without masking. The particular manner of masking is optional as long as an acoustically opaque member is utilized to substantially close a significant portion of the normally open grille area. The vibratory horn grille shown in FIGS. 1–3 comprises a die cast zinc grille which is cast with masking over the entire face of the grille, and a blanking die is utilized to punch out the desired openings S which in the FIG. 1 embodiment are located in four rectangular corner areas outside of the masked area which forms a cross design. However, one could utilize a standard grille and apply masking tape in the form of a cross pattern, and in that alternative manner produce a masked horn grille of the type shown in FIG. 1.

Figure 4:
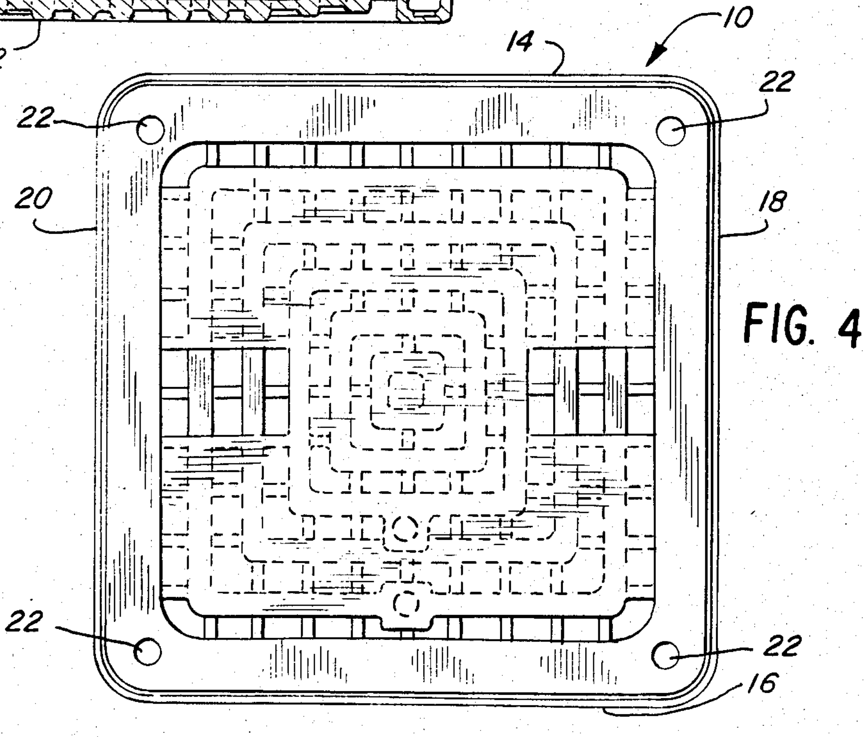
FIG. 4 is a front elevational view of a vibratory horn grille showing an alternative masking pattern for an acoustically opaque member which blocks normally open areas of the sound wave egress grille.
Figure 5:
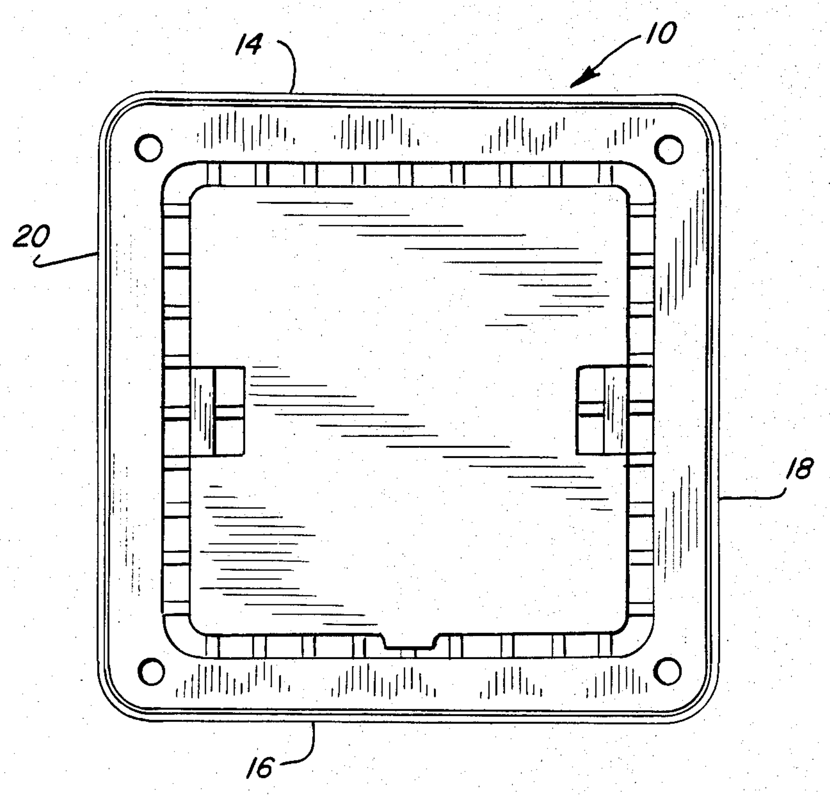
FIG. 5 is a front elevational view showing a further alternative masking pattern for an acoustically opaque member blocking openings in the front of a horn grille.
Figure 6:
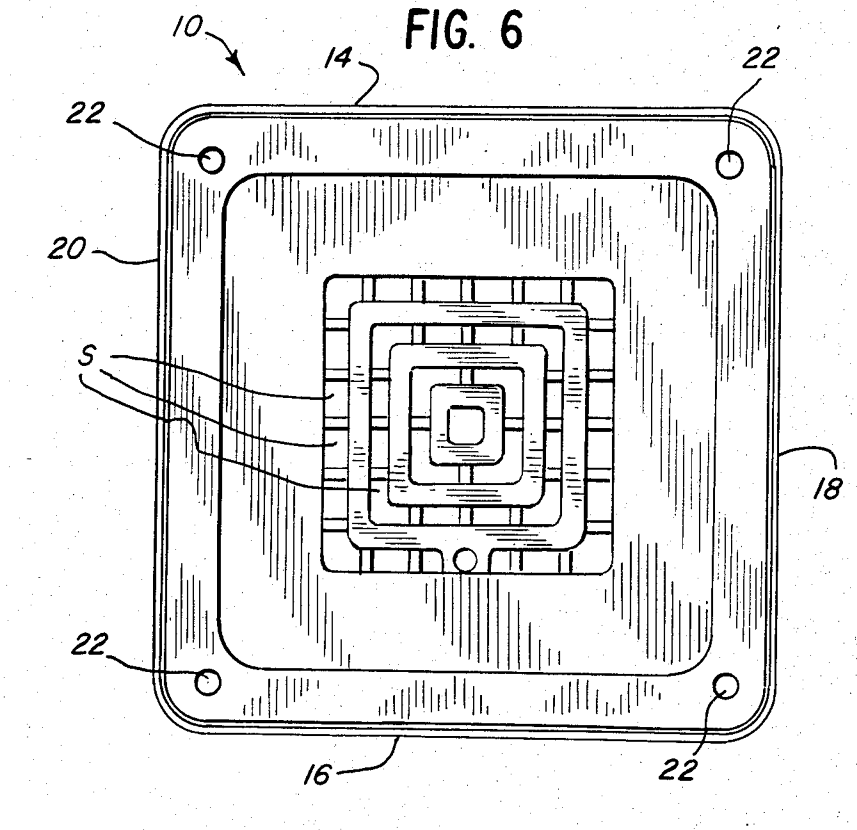
FIG. 6 is a front elevational view showing still another alternative masking pattern for an acoustically opaque member blocking openings in the front of a horn grille.

FIGS. 4–6 show the same basic grille 10, and these embodiments differ from one another only in the pattern of the masked area on the grille face 12. In FIG. 4, the masking is generally in the form of a horizontal H-pattern which leaves a strip of openings S across the top and bottom of the grille face, and two rectangular open areas at the sides of the grille face intermediate the top and bottom strips of openings. Experiments have indicated that the percentage of open area is important to achieving enhanced energy transfer and maximum sound output, rather than the precise arrangement of the masked area on the face of the grille. In the embodiment of FIG. 4, the open area is approximately 11% of the total grille area. The efficiency, or acoustical watts produced divided by electrical watts input, for the FIG. 4 embodiment has been found to be 4.3%, an improvement of 50.3% over the same grille without masking.

FIG. 5 illustrates the grille 10 with a further alternative masking pattern. In FIG. 5, the masking is in the form of a square masked area which leaves a peripheral border of openings S completely surrounding the masked area, and which leaves two additional openings S at each side of the grille intermediate the top and bottom thereof. In the embodiment of FIG. 5, the open area is approximately 13.7% of the total grille area. The efficiency, or acoustical watts produced divided by electrical watts input, for the FIG. 5 embodiment has been found to be 4.3%, an improvement of 50.3% over the same grille without masking, the foregoing improvement being the same as for the FIG. 4 embodiment.

FIG. 6 illustrates the grille 10 with still another alternative masking pattern. In FIG. 6, the masking is in the form of a rectangular border strip which leaves a central square area where the openings S remain open. In the embodiment of FIG. 6, the open area is approximately 12.5% of the total grille area. The efficiency, or acoustical watts produced divided by electrical watts input, for the FIG. 6 embodiment has been found to be 4.38%, an improvement of 53.1% over the same grille without masking.

In addition to improving the acoustical output of audible devices of the vibrating diaphragm type by utilizing masking of conventional grille openings in accordance with the present invention, it will be understood that in accordance with the present invention one may mount an acoustically opaque sign or other acoustically opaque member on the front of a horn grille, and if arranged to block only an appropriate predetermined portion of the normally open grille space, the resulting blockage will not impair sound output but on the contrary will enhance it.

Figure 7:
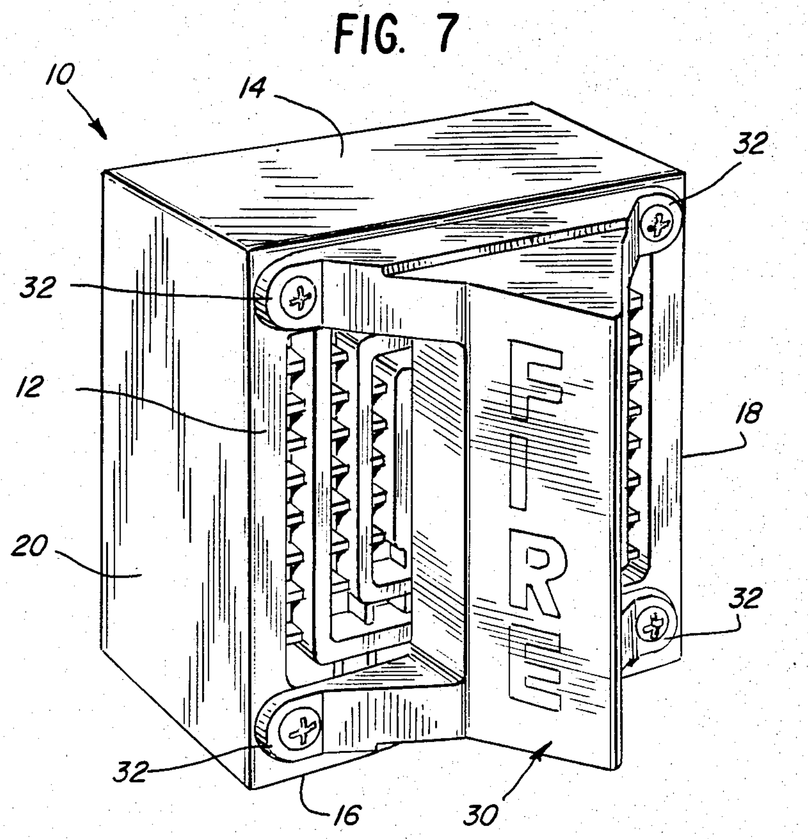
FIG. 7 is a perspective view showing an acoustically opaque warning sign mounted on the front of a vibratory horn grille so as to mask normally open areas of the grille.

Reference is now made to FIG. 7 which shows the same basic horn grille 10 having a warning sign 30 mounted across the front 12 of the grille. The sign 30 includes four corner lugs 32 which fit over the previously described screw openings 22 in the grille face 12. The sign 30 may thus be mounted by using the existing mounting holes 22, without requiring modification of the grille 10. The particular sign 30 shown in FIG. 7 covers or masks certain areas of the grille 12 to achieve essentially the same effect as the masking described in the embodiments of FIGS. 1–6. In this instance, the masked area comprises a relatively wide vertical strip down the center of the grille, and two narrow strips across the top and the bottom of the grille. The resulting open areas comprises a pair of rectangular areas, one on each side of the grille, which are longer in their vertical dimension as compared to their horizontal dimension.

The sign 30 of FIG. 7 may be dimensioned to provide a desired predetermined percentage of open grille area comparable to the embodiments of FIGS. 1–6. If desired, the sign itself may be relied upon to provide the desired masking of the grille. Alternatively, the masking may be provided in the casting of the grille and subsequent punching of the desired openings in the manner previously described to produce a masking pattern which corresponds to the outline of the sign. In the latter case the improved audible output will be achieved by such masking and will be wholly unaffected by mounting of the sign, which is of the same outline as the masking and thus does not affect the predetermined open area of the grille. In either case, it is important to understand that contrary to what has heretofore been believed, it is possible to mount a sign or other acoustically opaque member on the front of the egress grille for a vibrating diaphragm type audible device and thereby improve rather than impair the acoustical output of the device.

Figure 8:
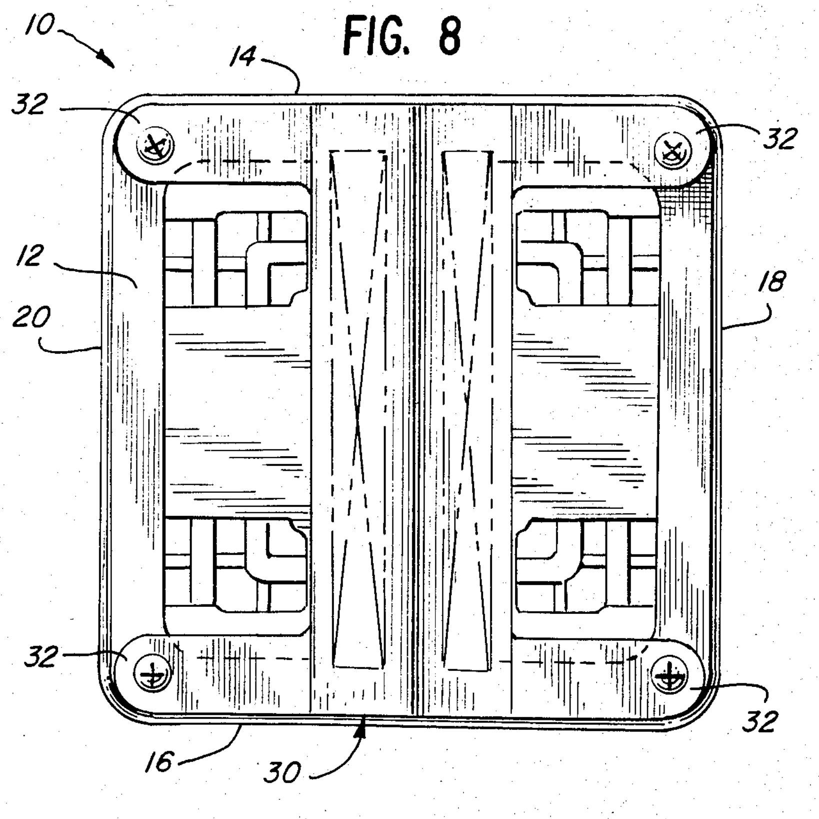
FIG. 8 is a front elevational veiw showing still another alternative pattern for an acoustically opaque member blocking openings in the front of a vibratory horn grille.

FIG. 8 shows the same basic grille 10 with an additional alternative masking pattern. The masking pattern is that which would be produced by the sign 30 of FIG. 7, but with an additional wide horizontal masking strip. The pattern of FIG. 8 will also be recognized as similar to the cross masking pattern of FIG. 1, but with a narrow horizontal masking strip added across both the top and bottom of the grille. The remaining open areas where the openings S are not masked are in the form of four small rectangular areas generally located in the four corners of the grille. In the embodiment of FIG. 8, the open area is approximately 9.3% of the total grille area. The efficiency, or acoustical watts produced divided by the electrical watts input, for the FIG. 8 pattern has been found to be 4.13%, an improvement of 44.4% over the same grille without masking.

As shown by the above data, variations in masking patterns have been found to result in different degrees in the percentage of improvement in sound output which is achieved by such masking as compared to a conventional unmasked grille. However, the differences in enhancement of energy transfer produced by different masking patterns have been found to be relatively small as contrasted with the importance of controlling the degree of masking to achieve a preferred percentage of open grille area as compared to total grille area. In the several embodiments of FIGS. 1–8, the percentage of open grille area as described hereinabove is in the range of 9% to 14% open. Based upon such experiments, it is believed the preferred range for the masking is to leave 9% to 15% open space compared to the total area of the grille, as contrasted with conventional horn grilles which are often 60% or more open. However, significant improvements in energy transfer for vibrating diaphragm type audible devices can be achieved through masking down to a range of 5% to 25% open.

The cross-shaped masking pattern of FIG. 1 has the advantage that a vertical sign as shown in FIG. 7 can be mounted on the front of the grille, or a horizontal sign can be mounted thereon, without varying the acoustical output of the audible device, as long as the sign merely covers portions of the grille which have already been masked. For the foregoing reason, there are advantages in using relatively simple masking patterns which can be made to correspond to the area of a sign to be mounted on the grille face. It will of course be understood that the cross pattern of FIG. 1 can be modified by providing only the vertical or the horizontal portion thereof.

It is important to understand that the present invention is based on the discovery that masking of a grille as described herein significantly increases energy transfer of a vibrating diaphragm type audible device such as a vibratory horn. It is believed the masking improves the efficiency of the vibrating diaphragm member. On the other hand, the present invention is not intended for use with other audible devices such as speakers which do not include a vibrating diaphragm.

It will further be understood that existing vibratory horns such as wall mounted emergency warning horns may be modified in accordance with the present invention by masking the horn grille through addition of an acoustically opaque member, which member can be masking tape, or if desired can be an acoustically opaque sign mounted on the horn grille as shown in FIG. 7.

What is claimed is:

1. A grille for use with a vibrating diaphragm type audible device comprising a grille body including a front grille wall having plurality of openings therein to provide an acoustical wave egress port, and acoustically opaque masking means provided on said front grille wall to reduce the open space therein to a range of 5% to 25% compared to the total area of said front grille wall.

2. A grille of the type defined in claim 1 where said masking means reduces the open space to a range of 9% to 15% open.

3. A grille of the type defined in claim 1 where said masking means includes an acoustically opaque vertical masking strip down through the center of said front grille wall from the top to the bottom thereof.

4. A grille of the type defined in claim 1 where said masking means includes an acoustically opaque horizontal masking strip across the center of said front grille wall from the left side to the right side thereof.

5. A grille of the type defined in claim 1 where said acoustically masking means includes a vertical masking strip down through the center of said front grille wall from the top to the bottom thereof, and a horizontal masking strip across the center of said front grille wall from the left side to the right side thereof, said vertical and horizontal masking strips intersecting to form a cross-shaped masking pattern.

6. A grille for a vibrating diaphragm type audible device as defined in claim 1 comprising a grille body including a front grille wall having a plurality of openings therein to provide an acoustical wave egress port, and acoustically opaque masking means provided on said front grille wall to reduce the open space therein and thereby increase the acoustical output, said masking means including a masking strip which extends through the center of said front grille wall completely across said wall.

7. A method of increasing the acoustical output of a vibrating diaphragm audible device of the type having a grille mounted on the front thereof with a plurality of openings to provide an acoustical wave egress port, said method comprising masking a substantial portion of the front of said grille with an acoustically opaque member to reduce the open space to a range of 5% to 25% compared to the total area of said front grille wall.

8. A method as defined in claim 7 comprising reducing the open space to a range of 9% to 15% compared to the total area of said front grille wall.

9. A grille for use with a vibrating diaphragm-type audible device comprising a grille body including a front grille wall having a plurality of openings therein to provide an acoustical wave egress port, and masking means provided on said front grille wall to reduce the open space therein to a range of 5% to 25% compared to the total area of said front grille wall, said masking means including an acoustically opaque sign mounted across said front grille wall.

10. A grille of the type defined in claim 9 where said front grille wall includes a masking strip which extends completely across a portion of said front grille wall, and also extends under said acoustically opaque sign, which is mounted on said front grille wall in overlying relation to said masking strip.

* * * * *